United States Patent [19]

Roland

[11] Patent Number: 4,514,252

[45] Date of Patent: Apr. 30, 1985

[54] TECHNIQUE OF PRODUCING TAPERED FEATURES IN INTEGRATED CIRCUITS

[75] Inventor: James P. Roland, Ft. Collins, Colo.

[73] Assignee: Hewlett-Packard Company, Palo Alto, Calif.

[21] Appl. No.: 442,545

[22] Filed: Nov. 18, 1982

[51] Int. Cl.³ .................... B44C 1/22; C03C 15/00; C03C 25/06

[52] U.S. Cl. .................... 156/643; 156/646; 156/651; 156/659.1; 156/661.1; 204/192 E

[58] Field of Search .............. 156/643, 646, 650, 651, 156/659.1, 661.1; 427/38, 39; 204/192 E

[56] References Cited

U.S. PATENT DOCUMENTS 3,428,503  2/1969  Beckerle ..................... 156/661.1 X
3,878,008  4/1975  Gleason et al. .............. 156/661.1 X Primary Examiner—William A. Powell
Attorney, Agent, or Firm—John A. Frazzini

[57] ABSTRACT

A technique is presented for producing tapered walls. In accordance with the disclosed technique, a mask is generated on a workpiece and the workpiece is etched through the mask to replicate the mask pattern into the mask. These steps result in walls at the boundaries of the replicated mask features. In many such processes, these walls are either substantially vertical or have an overhanging portion of the walls. In order to taper the walls, the upper corners of the walls are cut away to remove the overhang or to cut the corner back an additional amount to produce a controlled amount of taper.

5 Claims, 8 Drawing Figures

TECHNIQUE OF PRODUCING TAPERED FEATURES IN INTEGRATED CIRCUITS

BACKGROUND OF THE INVENTION

In the production of integrated circuits, control of the etching process can be crucial to good performance and high production yield. The use of increasingly narrow line widths increases the difficulty of accurately replicating mask patterns into layers underlying the mask. Some of the problems which can result are illustrated in FIGS. 1A–1D for a pair of parallel conductive lines generated over an underlying feature.

In FIG. 1A is shown a cross-section in the x-z plane of a typical wafer at a point in the processing when a mask has been generated but the mask pattern has not yet been replicated into the layer or layers below the mask. The portion of the mask shown in FIG. 1A includes a feature 10 which extends in the y-direction and which is to be replicated into a layer 12. Layer 12 is exposed to etchant gases through the open regions in the mask to etch away the exposed regions of layer 12. This etch step replicates the mask pattern into layer 12 and generates walls of the replicated features extending down into layer 12 from the boundaries 11 of the mask. For some materials and choices of etch parameters, when an anisotropic process (eg. plasma etching in a parallel plate system) is utilized to transfer the mask pattern into layer 12, the resulting feature 13 has curved concave walls as shown in FIG. 1B. The overhang from point 16 to point 17 can produce a number of problems as discussed later. For other materials and process parameters, the resulting feature 14 has nearly vertical walls as shown in FIG. 1C. Some of the problems which can result with either type of wall structure become particularly severe when the height of feature 14 is comparable to or larger than its linewidth.

In FIG. 1D is shown the wafer of FIG. 1C after the mask has been removed and an insulating layer 15 has been deposited on it. As is illustrated in FIG. 1D, the topography of layer 15 reflects the topography of patterned layer 12. Such topography increases the difficulty of accurately patterning layer 15 and any additional layers above layer 15. For example, in a process that utilizes a projection photolithography process to generate masks, the projection photolithography apparatus projects into a focal plane a focussed image of the pattern to be replicated. If the surface of the wafer is not planar, then there is some degradation of the pattern projected onto the wafer surface because of irregular reflections off of non-planar underlying layers. This problem becomes increasingly prevalent as line-widths decrease because, under standard scaling theory, the ratio of the height of a feature to its line-width increases with decrease in line-width so that deviation from surface planarity increases with decrease in line-width.

The sharp corners at points 16 and 18 in FIG. 1D can affect circuit operation because of charge concentration at such corners. The sharp corners at points 16 and 18 in FIG. 1B or at points 19 and 110 in FIG. 1C can also produce in layer 15 a region, indicated by dotted line 114, which etches faster than the remainder of layer 15. The problems which can result from such local high etch rate regions can be seen by considering what happens in the case in which layer 15 is an insulator in which a pair of channels, running in the x-direction and displaced from one another by a distance in the y-direction on the order of a linewidth, are etched clear through layer 15 and then filled with conductive material to form a pair of parallel conductors. During the step of etching the channels, the increased etch rate in the region indicated by dotted line 114 will result in a cavity being generated in that region and this cavity is then filled with conductive material when the channels are filled. Material in such cavities can be difficult to etch away in subsequent etch steps leaving undesired residues. In those cases where the enhanced etch rate is large enough, such cavities can extend clear through the insulating material between the pair of conductive lines, thereby creating unexpected shorting of one line to the other.

Features having the shape of feature 13 in 1B have similar and perhaps more severe problems due to sharp corners 16 and 18 than features having right angled corners like corners 19 and 110 in FIGS. 1C and 1D. Therefore, it is advantageous to utilize a processing technique that generates tapered walls. In one such technique disclosed by S. U. Vim in the reference "Method of Removing Nitride Overhang Ledge By Differential Etch Technique", IBM Technical Disclosure Bulletin, Vol. 21, No. 4, September 1978 beginning on page 1369, a hole having tapered walls is produced by use of both a plasma etch step and a wet etch step. In that process, a silicon body is coated with a silicon dioxide layer on top of which is a silicon nitride layer. A photoresist mask is formed on top of the nitride layer and utilized in an isotropic plasma etch step in which the nitride layer is etched back under the photoresist layer and the portion of the oxide layer exposed through the resulting hole in the nitride layer is also etched part way down to the silicon body. The photoresist mask is removed and then an isotropic wet etch step is applied to complete the etch through the oxide layer and to further etch back the nitride layer. This process does result in tapered walls but only at the expense of a process requiring both wet and dry etch steps.

In another technique disclosed by W. W. Koste, et al in the reference "Via Profiling By Plasma Etching With Varying Ion Energy", IBM Technical Disclosure Bulletin, Vol. 22, No. 7, December 1979, pages 2737-2738, a hard mask which does not etch in a plasma is utilized and the layer to be patterned is first etched part way by an isotropic plasma etch and then the etch is completed by an anisotropic plasma etch. The isotropic etch step produces a wider hole than the anisotropic etch step so that the walls of the resulting hole are tapered. Unfortunately, this process is not compatible with many parallel plate etch systems because it requires the wafer to be raised above the lower electrode. In many systems, the space between electrodes is too small to easily accommodate a pedestal and in any case a custom design would be required.

In a third technique disclosed by J. A. Bondur and H. A. Clark in "Plasma Etching for $SiO_2$ Profile Control", *Solid State Technology*, April 1980, p. 122, a photoresist mask is formed on a silicon dioxide layer and then heated so that the resist mask softens and, because of surface tension, develops tapered walls. The etch rate ratio of silicon dioxide to photoresist is controlled to match the ratio between the thicknesses of oxide and photoresist so that, as both are etched in an anisotropic reactive ion etch step, the profile of the resist is replicated into the oxide layer. This technique suffers from the difficulty of ensuring that the etch rate ratio equals the ratio of thicknesses and also limits the profile to the shape assumed by the resist mask during the bake step.

SUMMARY OF THE INVENTION

In accordance with the illustrated preferred embodiment, an etch process is presented which produces tapered walls. A mask is generated on top of a layer of material into which the mask pattern is to be replicated and then the pattern is replicated into this layer by either an isotropic etch step or an anisotropic etch step. The mask is next subjected to an isotropic etch which etches the mask faster than the exposed layers under the mask so that the mask is etched back from the edges of the replicated features thereby exposing the upper corners of the replicated features. The underlying layer is etched anisotropically part way through the layer so that the upper corners of all of the features are removed, thereby producing tapered walls on all of the features.

In the case of walls having an overhang, the process can be controlled to remove just the overhangs, or can be controlled to cut away more of the upper corners thereby producing a greater amount of taper. In the case of substantially vertical walls, the wall is preferably etched approximately half way down so that the wall most closely approximates a uniform taper. The steps of etching back the resist and cutting off the corner can be iterated so that the walls are tapered by more than one step.

This process has the significant advantage that it can be practiced in standard etching apparatus without requiring modification of the apparatus. It also has the advantage that, for many applications, it can be performed in a single parallel plate plasma etch apparatus. In such a case, the reactant gases and plasma etch parameters are initially selected to anisotropically etch the layer of material into which the mask pattern is to be replicated. When the step of etching this layer has been completed, the reactant and product gases are evacuated from the reaction chamber and then replaced by reactant gases suitable for etching the mask. These reactant gases and the etch process parameters are selected to etch the boundaries of the mask features away from the edges of the features which have been replicated into the layer to be patterned. The reaction chamber is again evacuated to prepare for an iteration of these steps or to clear the reaction chamber of reactant gases so that other workpieces to be etched can be inserted into the reaction chamber. It takes only a short time to evacuate the chamber and replace the reactant gases so that this process is suitable for multistep production processing.

DESCRIPTION OF THE PREFERRED EMBODIMENT

Figure 1A:
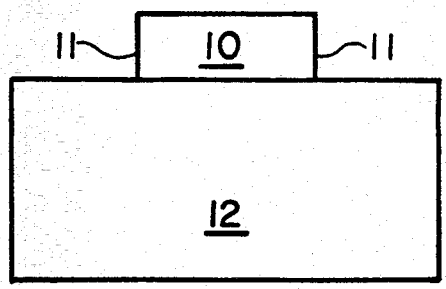
FIGS. 1A-1C illustrate etch steps common in the prior art which result in features having vertical wall or walls with overhangs.

In FIG. 1A is shown a portion of a mask 10 that has been generated, by any of a number of standard masking processes, on top of a layer 12 of material which is to be etched to replicate the pattern of the mask. Layer 12 is next etched by any of a number of standard processes such as an isotropic chemical wet etch, an isotropic plasma etch (eg. in a barrel etch system or in a parallel plate system with the material to be etched being situated in the plasma) or an anisotropic plasma etch (eg. in a parallel plate etch apparatus in which the material to be etched is in a dark space between the plasma and an electrode). An anisotropic etch is preferred because it preserves line-width and thus is most useful in narrow line-width (on the order of 1 micron or less) applications.

Figure 1B:
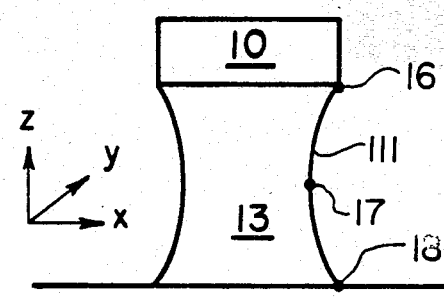
Figure 1C:
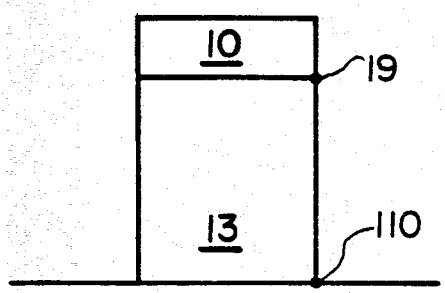
Figure 1D:
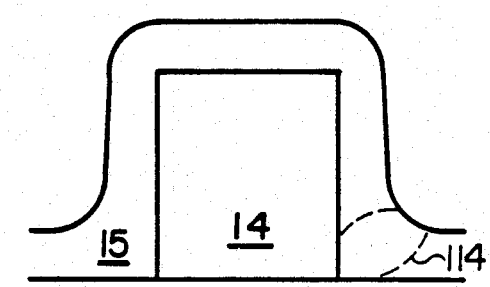
FIG. 1D illustrates some problems which result when underlying features have vertical walls or walls with overhangs.
Figure 2A:
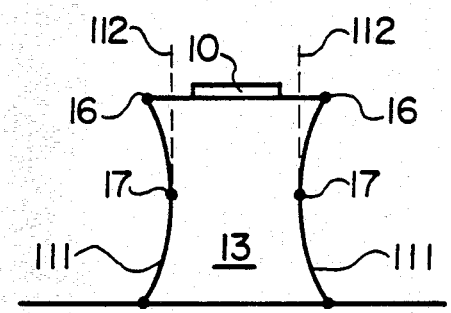
FIGS. 2A-2B in conjunction with FIGS. 1A and 1B illustrate the disclosed process in which the upper corners of the replicated patterns are cut back to form tapered walls on the replicated features.

In some cases, an anisotropic etch results in a feature having substantially vertical walls as shown in FIG. 1C. In other cases the etch results in a feature as shown in FIG. 1B. In that figure, feature 13 has curved walls 111 and sharp overhanging corners 16 at the interface between mask 10 and layer 12. As discussed in the Background, sharp overhanging corners can affect circuit operation by concentrating charge at such corners and can also inhibit subsequent etch steps resulting in undesired residues. Therefore, these undesired overhanging corners are removed to produce stepwise tapered walls. In order to remove these corners, resist mask 10 is subjected to an isotropic etch that etches it away from walls 111 of the underlying replicated pattern in layer 12. The resulting structure is shown in FIG. 2A. In order to remove the overhang, it is only necessary to etch the mask back to dotted lines 112, but additional taper in the walls can be produced by etching the mask further as shown in FIG. 2A.

Figure 2B:
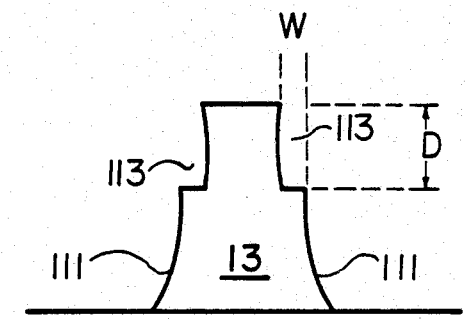

Feature 13 is next subjected to an anisotropic etch to remove the corners leaving steps 113 thereby producing stepwise tapered walls as shown in FIG. 2B. Preferably, corners 16 are removed to a depth D and a width W approximately equal to that of point 17 (the point of greatest indentation of wall 111) so that the overhang is completely removed. Because the wall is vertical at point 17, the actual depth can be somewhat deeper or shallower than point 17 and still result in zero or negligible overhang. Typically, the corner is removed to a depth between 15% and 85% of the depth of the layer being etched. However, in order to preserve the greatest amount of cross-sectional area in feature 13, it is preferred that the etch be no deeper than point 17 and indeed can be somewhat shallower in order to preserve additional cross-sectional area of feature 13. The width W is also generally selected to be approximately the same as point 17 but in some cases is selected to be somewhat greater in order to produce additional taper, for example to enhance coverage of features to smooth out upper layers.

Figure 3:
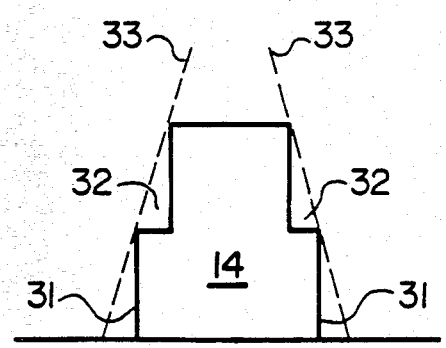
FIG. 3 shows the result of the process shown in FIGS. 2A-2B for the case of replicated features having substantially vertical walls.
Figure 4:
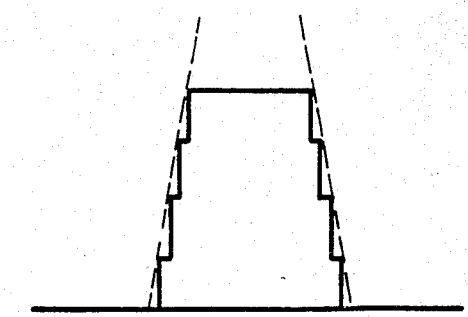
FIG. 4 shows the result of a particular embodiment of the disclosed process in which the steps illustrated in FIGS. 2A and 2B ar iterated to produce multistep tapered walls.

In FIG. 3 is shown a stepwise tapered feature produced in accordance with the disclosed process for the case of substantially vertical anisotropic etching. In that Figure, a feature 14 is shown having corners of walls 31 etched away to produce indentations 32 so that the walls are stepwise taper along dotted lines 33. For the case of vertical walls, the corner should be etched approximately half way down to produced a two step stepwise taper most nearly approximating a smooth taper. The steps of etching back the mask and then removing the corner can be iterated to produce a multistep taper as shown in FIG. 4. This profile more nearly approximates a smooth taper, but only at the expense of extra processing steps so that a two step taper is generally preferred. However, because of the relatively short time for each processing step, the multistep tapered wall can be produced in a production process application. The width W and depth D of each step cut into the wall can be regulated to approximate any desired wall profile. The process can be automated by placing it under the control of a computer or microprocessor and still retain the ability to modify the parameters in response to user input so that adjustments can be made to compensate for variations in parameters such as the composition of the materials in the layer being patterned and of the mask layer.

Some care must be taken in the choice of reactant gases and etch parameters in the steps of etching the layer of material into which the mask pattern is to be replicated. The reactants and parameters should be chosen to insure that the mask can subsequently be isotropically etched. Especially in the case of resist masks, certain reactant gases can harden the resist so that the walls of the mask do not etch uniformly. Similarly, too much power, too low pressure or too low frequency can produce undesired polymerization of the resist mask. The mask can also become coated by reaction products from the step of etching the underlying layer and result in an impaired ability to etch the resist isotropically. These and similar problems are dependent on the choice of material being etched and therefore must be evaluated for each choice of material and mask. It should be noted that, although the disclosed process is primarily motivated by applications in the production of integrated circuits, the process is generally applicable to the generation of patterns having tapered walls.

I claim:

1. A process of generating tapered walls in a process of the type in which a mask having a plurality of features is generated on a workpiece to be etched and the workpiece is exposed to etchants through the open areas of the mask to replicate the features of the mask into a workpiece, thereby producing, at the boundaries of each feature, walls which have upper corners at the interface between the mask and the workpiece, said process, in order to cut back the upper corners to taper the walls generated in the workpiece, further comprising the steps of:

(a) after replicating the mask features into the workpiece, isotropically etching the boundaries of the mask features away from the associated walls produced in the workpiece to expose the upper corners, the distance which the boundaries of the mask are etched away from the associated walls not being determined by an additional mask; and (b) exposing the workpiece to etchants to etch away the upper corners to a lesser depth than the depth of the walls of the mask pattern replicated into the workpiece.

2. A process as in claim 1 wherein step (b) comprises the step of anisotropically etching the workpiece to remove a controlled amount of the upper corners of the workpiece.

3. A process as in claim 1 wherein steps (a) and (b) are iterated a plurality of times to produce stepwise tapered walls having a plurality of steps.

4. A process as in claim 1 wherein the walls initially produced by the steps of replicating the mask features into the workpiece are substantially vertical and wherein the corner is cut back to a depth below the mask-workpiece interface substantially equal to one half the depth of the walls.

5. A process as in claim 1 wherein the walls initially produced by the steps of replicating the mask features into the workpiece are concave so that the upper corners are located at the top of an overhanging portion of the walls and wherein the step of cutting back the upper corners removes substantially only the overhanging portion of the walls.

* * * * *